United States Patent [19]

Wagatsuma

[11] Patent Number: 4,770,296
[45] Date of Patent: Sep. 13, 1988

[54] SEAL CONSTRUCTION FOR ELECTRICAL PARTS

[75] Inventor: Tadashi Wagatsuma, Furukawa, Japan

[73] Assignee: Alps Electric Co., Ltd., Tokyo, Japan

[21] Appl. No.: 6,936

[22] Filed: Jan. 27, 1987

[30] Foreign Application Priority Data

Apr. 14, 1986 [JP] Japan .............. 61-54848[U]

[51] Int. Cl.⁴ .................................... B65D 73/02
[52] U.S. Cl. .................................. 206/330; 206/329; 206/820; 439/492
[58] Field of Search ............... 206/328, 330, 332, 334, 206/820, 329; 339/176 MF

[56] References Cited

U.S. PATENT DOCUMENTS

| 1,851,957 | 3/1932 | Gilfillan et al. | 206/330 X |
|---|---|---|---|
| 2,748,452 | 6/1956 | Pierce | 206/330 X |
| 3,184,054 | 5/1965 | Kuhlman | 206/820 X |
| 3,899,074 | 8/1975 | Lucas | 206/330 X |
| 4,012,608 | 3/1977 | Lockard | 200/16 D |
| 4,298,120 | 11/1981 | Kanakeo et al. | 206/329 |
| 4,633,370 | 12/1986 | Hamuro et al. | 206/330 X |

FOREIGN PATENT DOCUMENTS 0066339 12/1982 European Pat. Off. ............ 206/332

Primary Examiner—Stephen Marcus
Assistant Examiner—Bryon Gehman
Attorney, Agent, or Firm—Guy W. Shoup; Leighton K. Chong; Paul J. Winters

[57] ABSTRACT

The present invention discloses a seal construction for electrical parts such as switches. It comprises a casing having a cavity therein, a tape adhered to an upper surface of the casing to block the cavity, and one or more lug portions provided on the tape. The lug portion has a sharpened shape.

2 Claims, 4 Drawing Sheets

SEAL CONSTRUCTION FOR ELECTRICAL PARTS

BACKGROUND OF THE INVENTION

1. Field of the Invention

The present invention relates to a seal construction for electrical parts such as switches, and more particularly to a seal construction for an electric part of the type in which after having been brazed to a substrate, the parts together with the substrate are cleaned.

2. Description of the Prior Art

For example, in the case where a dual inline package switch hereinafter referred to DIP switch) is actually mounted on a substrate, normally, terminals provided on the DIP switch are soldered onto the substrate, after which they are cleaned to remove flux used during soldering. To effect such a cleaning together with the substrate, it is necessary that the DIP switch is of a closed construction. The seal construction therefor so far known is shown in FIGS. 4 and 5.

In these figures, a box-type casing 1, which is formed of a synthetic resin, is provided at opposite sides thereof with plural pairs of terminals disposed at predetermined intervals, each pair of terminals 2 being formed of electrically conductive material, the terminals 2 forming contacts for the switch interiorly of the casing 1. On the casing 1 is internally placed a panel 4 formed of a synthetic resin or metal, the panel 4 and the casing 1 constituting a switch shell or a casing. Within a cavity A interiorly of the casings 1 and 4 is movably encased plural sets of slides 3 and movable contacts 3b. Lugs 3a protruding from the upper portion of the slides 3 are exposed from a plurality of holes 4a. respectively, bored in the panel 4. Further, a sealing tape 5 is adhered to the upper surface of the panel 4 so as to block the holes 4a, and a lug portion 5a projecting from the panel is formed on one end of the tape. As shown in FIG. 6, this tape 5 is formed by adhering a narrow mask film 8 to one end of a lengthy base film 7 coated with an adhesive 6 on the whole area of the lower surface thereof, and thereafter punching it into a rectangular form in a position indicated by dash-dotted contour lines. Only the base film 7 is adhered to the panel 4 by the adhesive 6, and the lug portion 5a comprises a laminate in which the base film 7 and the mask film 8 are integrated through the adhesive 6.

In the case where the DIP switch of the closed construction is actually mounted on a substrate not shown, flux is coated in a state wherein each terminal 2 is inserted into a through-hole of the substrate, and each terminal 2 and a pattern of the substrate are fixed by soldering. If the flux is left after soldering, the pattern becomes easily corroded. Therefor, the flux may be removed by cleaning such as washing with water after completion of soldering. At that time, since the DIP switch is formed into a closed construction by the tape 5 applied to the upper surface of the casing, cleaning liquids are not entered into the cavity A during cleaning, whereby the soldered DIP switch may be cleaned together with the substrate. After the DIP switch has been mounted on the substrate in a manner as described, the lug portion 5a of the tape 5 projecting from the panel 4, i.e., a portion having no adhesion where the base film 7 and the mask film 8 are stacked one over another is picked up by fingers, whereby the tape for seal is peeled away from the panel 4. Thereafter, the lug 3a exposed onto the panel 4 is slidably moved to select a contact state between the movable contact 3b and the terminal 2 thereby obtained is a circuit as desired.

Incidentally, the mounting of a DIP switch to a substrate is normally automatically carried out by use of a device called an insertion machine for the purpose of labor-saving. This insertion machine inserts terminals 2 of DIP switch supplied int desired throughholes of a substrate. Since DIP switches are successively supplied to the insert machine, the DIP switches are housed into a magazine and are transported.

FIG. 7 is a perspective view showing one example of a magazine of this kind. Within a transparent magazine 9 made of synthetic resin is housed and disposed a plurality of DIP switches of the closed construction as described above in the lengthwise direction of the magazine. This magazine 9 has a generally A-shape, and a bottom surface 9a formed to be projected toward the upper surface extends in a longitudinal direction so that DIP switch is encased in such a manner that each of the terminals 2 may straddle on the bottom surface 9a. To mount the DIP switch housed in the magazine 9 on the substrate, the magazine 9 is made to be inclined through a predetermined angle, whereby the DIP switch is transported by utilizing its own weight thereof, thus successively supplying them to the insert machine. More specifically, by inclining the magazine 9, the DIP switches may be slidably glided on the bottom surface 9a and therefore, the lowermost DIP switch positioned in the open end of the magazine 9 is first caught by the insert machine, and the thus caught DIP switch is arranged in position on the substrate.

However, the above-mentioned conventional DIP switch of the closed construction has a difficulty in that as may be best shown in FIG. 8 which is an enlarged view of the part A of FIG. 7 the adhesives 6a forced out of the tapes 5 of the adjoining DIP switches stick each other to make it impossible to mount the DIP switches on the substrate one by one. This results from the fact that when the tape 5 is punched, the adhesive 6 is forced out of a cutting line by a punching blade. In the conventional tape 5 cut into a rectangular shape, the adhesive 6a forced out of the end of the lug portion 5a becomes stucked with the adhesive 6a forced out of the end of the tape 5 next to the former through a tape width with a relatively high adhesion.

Such an inconvenience is not limited to the case where the DIP switches are transported by the magazine 9 but similarly occurs also in case of the transporting by a part feeder.

SUMMARY OF THE INVENTION

It is therefore an object of the present invention to provide a seal construction for electrical parts which minimizes the sticking of tapes to each other during transportation overcoming the problems noted above with respect to prior art. For achieving the aforesaid object, the present invention provides seal construction for electrical parts in which a tape is adhered to the upper surface of a casing having a cavity portion therein so as to block said cavity portion, a lug portion projecting from the upper surface of said casing is provided on an end of said tape, characterized in that said lug portion is formed to have a sharp contour.

With the arrangement as described above, when electrical parts sealed by tapes are successively transported by a magazine or the like, tapes rarely stick to each other since the tapes of the adjoining electrical parts come into contact at a minor portion through a sharp contour portion formed in the lug portion

BRIEF DESCRIPTION OF THE ACCOMPANYING DRAWINGS

FIGS. 1 to 3 show an embodiment of the present invention, in which FIG. 1 is a perspective view of a DIP switch sealed by a tape, FIG. 2 is a plan view showing the state of transporting the DIP switch, and FIG. 3 is a fragmentary view in front of a part B of FIG. 2; and FIGS. 4 to 8 show a conventional construction, in which FIG. 4 is a sectional view of DIP switch sealed by a tape, FIG. 5 is a perspective view of the DIP switch, FIG. 6 is a perspective view showing the manufacturing step for a tape, FIG. 7 is a perspective view showing a state of transporting the DIP switch by means of magazine, and FIG. 8 is an enlarged view of a part A of FIG. 7.

DESCRIPTION OF THE PREFERRED EMBODIMENTS

Figure 1:
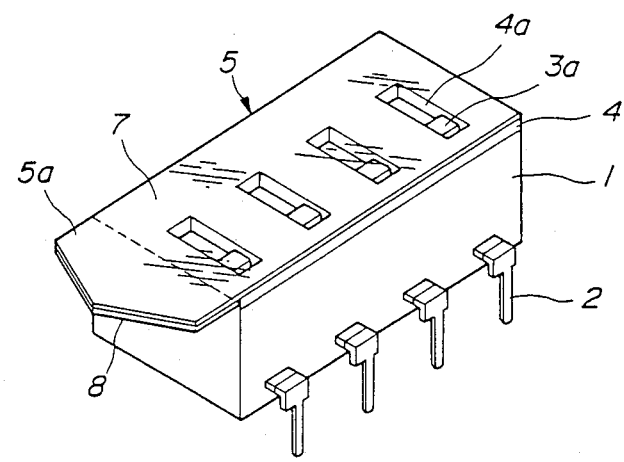
Figure 5:
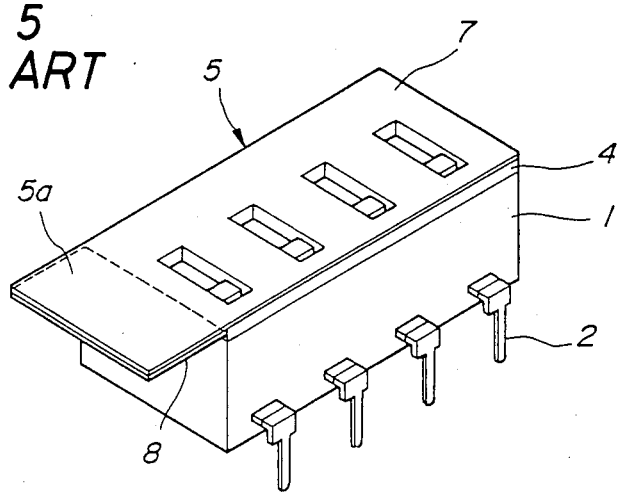
Figure 6:
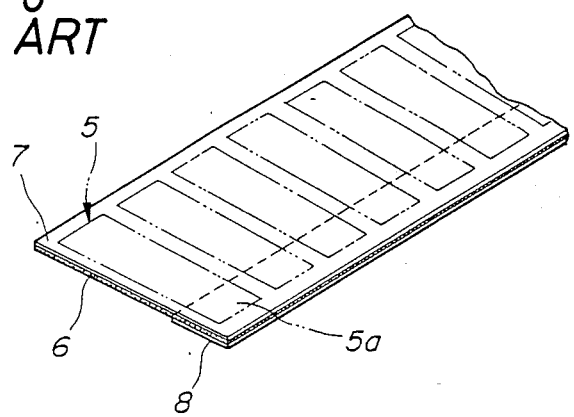
Figure 7:
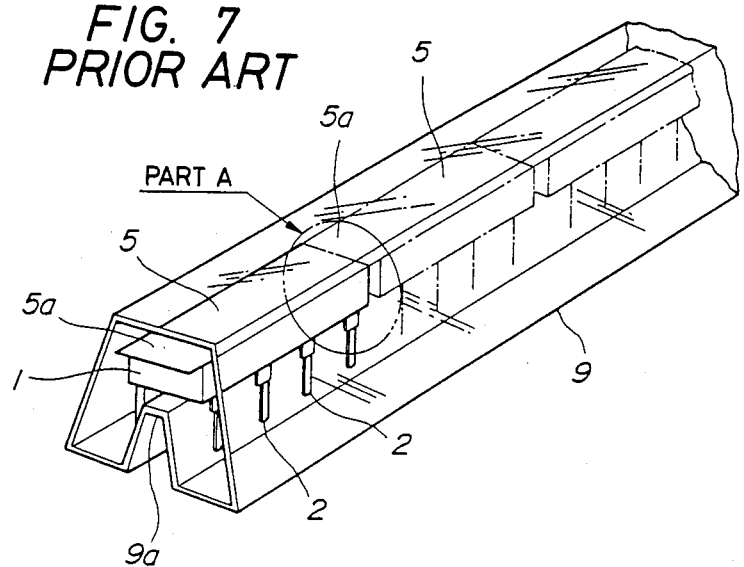
Figure 8:
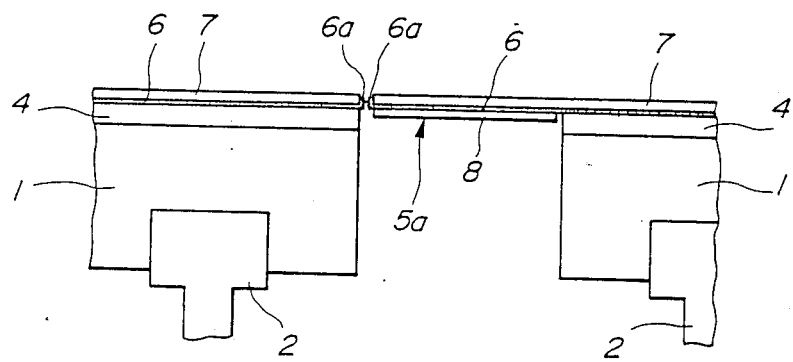

An embodiment of the present invention will be described hereinafter with reference to the drawings, in which FIG. 1 is a perspective view of DIP switch according to one embodiment of the present invention, wherein parts shown in FIG. 1 corresponding to those of FIG. 5 previously described will be indicated by the same reference numerals.

As shown in FIG. 1, a tape 5 for sealing the DIP switch is adhered to an upper surface of a panel 4 for the DIP switch so as to block holes 4a, and a lug portion 5a is protruded from one end of the tape 5. This lug portion 5a has a mask film 8 adhered to a lower surface of a base film 7 through an adhesive (not shown in FIG. 1) and is basically similar in construction to that of the prior art as previously described except that a front end of the lug portion 5a is sharpened as in a base.

More specifically, the tape 5 is formed by punching by means of a press or the like so that a narrow mask film 8 formed for example by vaporization of aluminum on a polyester film is adhered to one end of a lengthy base film 7 having the entire lower surface coated with adhesives through the adhesives, whereby only the base film 7 portion may take a rectangular shape corresponding to a contour of the panel and a laminated portion of the base film 7 and the mask film 8 may take a base-like shape. During the punching operation, a punching blade cuts the adhesives in all parts, and therefore, the adhesives are forced out of the cut tape 5 along the contour line thereof. The thus punched tape 5 is adhered by the adhesive to the upper surface of the panel 4 for the DIP switch to thereby enable to obtain a DIP switch of a closed construction as shown in FIG. 1.

Figure 2:
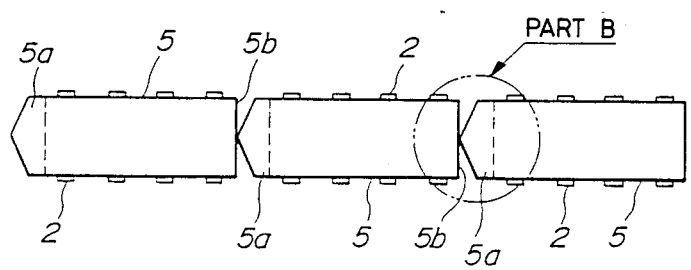
Figure 3:
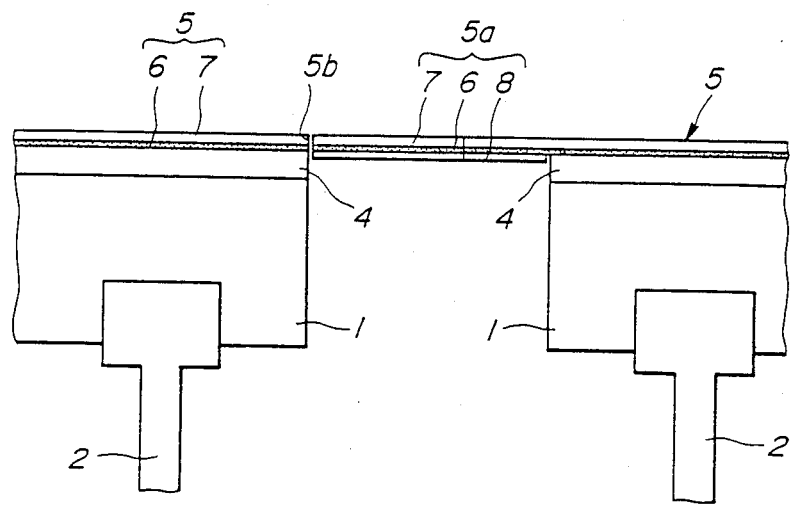
Figure 4:
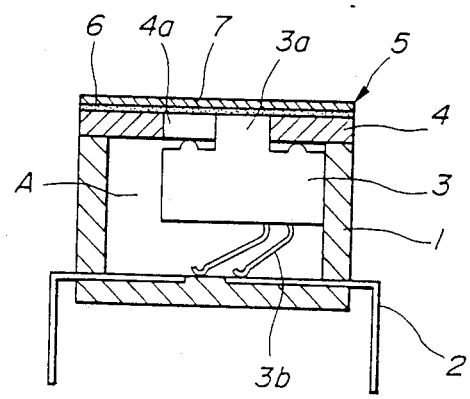

FIG. 2 is a plan view showing the state wherein DIP switches of a closed construction subjected to taping as described above are successively transported to an insertion machine within an unshown magazine, and FIG. 3 is a fragmentary view in front showing a part B of FIG. 2 in an enlarged scale. As shown in these figures, since each of the DIP switches are successively transported with a sharpened portion of the lug portion 5a of the tape 5 adhered to the upper surface thereof placed in contact with an end surface 5b of the tape 5, the adjoining tapes 5 rarely stick to each other. That is, in each tape 5, the adhesive 6 is apt to be forced out along the outer contour line thereof during the punching but when the DIP switches are successively transported, the adjoining tapes 5 are such that a lug portion 5a and an end 5b are merely in a point contact with each other and the remaining portions are not in contact, and therefore, even when the adhesive 6 is forced out, the DIP switches may be transported without having the tapes 5 stuck to each other.

While in the above-described embodiment, a description has been made of the case where the lug portion 5a was cut into a base-like shape, it is to be noted that the shape of the lug portion 5a is not limited thereto but a triangular or a circular shape may also be employed in place of a base-like shape. In short, it will merely suifice that the switches are transported in the state wherein the adjoining tapes 5 are in contact with each other at a minor portion. Furthermore, it is noted that lug portions 5a may be formed on opposite sides of a tape 5, in which case, at least one lug portion may be formed into a sharpened shape as described above.

What is claimed is:

1. In a seal construction for a longitudinal row of electrical parts each having a casing elongated in the longitudinal direction formed with a cavity therein, and a tape provided with an adhesive on one side thereof adhered to an upper surface of said casing to seal cavity, said tape having a lug portion on a front end protruding from the upper surface of said casing in said longitudinal direction of the casing, the improvement wherein said lug portion is formed into a sharpened shape having a triangular, transversely narrowing pointed end extending in the longitudinal direction for minimizing the amount of excess adhesive from said tape which may come into contact with a rear end of an adjacent electrical part in said row in the longitudinal direction.

2. The seal construction as defined in claim 1 wherein said lug portion is formed by adhering a mask film to the lower surface of a base film through an adhesive, said mask film being prepared by vaporization of aluminum on one end of the base film.

* * * * *